United States Patent
Keel et al.

(10) Patent No.: US 8,488,032 B2
(45) Date of Patent: Jul. 16, 2013

(54) IMAGE SENSORS, INTERFACES AND METHODS CAPABLE OF SUPPRESSING EFFECTS OF PARASITIC CAPACITANCES

(75) Inventors: Min-Sun Keel, Seoul (KR); Kwang Hyun Lee, Seongnam-si (KR)

(73) Assignee: Samsung Electronics Co., Ltd., Gyeonngi-Do (KR)

( * ) Notice: Subject to any disclaimer, the term of this patent is extended or adjusted under 35 U.S.C. 154(b) by 1645 days.

(21) Appl. No.: 11/984,071

(22) Filed: Nov. 13, 2007

(65) Prior Publication Data

US 2008/0204582 A1  Aug. 28, 2008

(30) Foreign Application Priority Data

Feb. 28, 2007 (KR) .................. 10-2007-0020383

(51) Int. Cl.
*H04N 3/14* (2006.01)
*H04N 5/335* (2011.01)

(52) U.S. Cl.
USPC ........................ 348/294; 348/241; 327/96

(58) Field of Classification Search
USPC ............................ 348/294, 241; 327/96
See application file for complete search history.

(56) References Cited

U.S. PATENT DOCUMENTS

| | | | |
|---|---|---|---|
| 6,084,440 A * | 7/2000 | Sousa | 327/94 |
| 6,111,606 A * | 8/2000 | Ikeda | 348/241 |
| 6,144,234 A * | 11/2000 | Nakamura | 327/94 |
| 6,222,175 B1 | 4/2001 | Krymski | |
| 6,919,551 B2 | 7/2005 | Barna et al. | |
| 2003/0146991 A1 | 8/2003 | Barna et al. | |
| 2003/0201923 A1* | 10/2003 | Uno | 341/150 |
| 2004/0096061 A1* | 5/2004 | Yano et al. | 380/59 |
| 2006/0220692 A1* | 10/2006 | Hirashima | 327/91 |
| 2008/0204582 A1* | 8/2008 | Keel et al. | 348/294 |

FOREIGN PATENT DOCUMENTS

KR    2006-0022804    3/2006

* cited by examiner

*Primary Examiner* — Antoinette Spinks
(74) *Attorney, Agent, or Firm* — Harness, Dickey & Pierce, P.L.C.

(57) ABSTRACT

An interface capable of suppressing parasitic capacitance effects includes an array of switches switched in response to a switching signal. The interface suppresses effects of parasitic capacitance included in a bus, which transmits a reset signal and an image signal output from an image sensor. The suppressed parasitic capacitance effects suppress distortion of a digital image signal.

7 Claims, 13 Drawing Sheets

IMAGE SENSORS, INTERFACES AND METHODS CAPABLE OF SUPPRESSING EFFECTS OF PARASITIC CAPACITANCES

PRIORITY STATEMENT

This non-provisional patent application claims priority under 35 U.S.C. §119 to Korean Patent Application No. 10-2007-0020383, filed on Feb. 28, 2007, in the Korean Intellectual Property Office, the entire contents of which is incorporated herein by reference.

BACKGROUND

Description of Related Art

A conventional image sensor is a device that generates still or video images. A conventional image sensor may be embodied as a charge coupled device (CCD) type or a complimentary metal oxide semiconductor (CMOS) type.

A pixel array in a conventional image sensor may include a plurality of pixels embodied in a two dimensional array or matrix, and the plurality of pixels may respectively output a reset signal and an image signal based on a row selection signal. Conventional image sensors may include many (e.g., hundreds of, thousands of or millions of) pixels to produce relatively high resolution images.

Conventionally, image sensors include a sample-and-hold array. A conventional sample-and-hold array may be embodied as a plurality of sample/hold units. The sample-and-hold array may sample-hold and output a reset signal and an image signal output from the pixel array to a signal converter. The signal converter may receive the reset signal and the image signal and generate a single ended signal. An output buffer may buffer the single ended signal and output a buffered single ended signal as a digital image signal.

Conventional sample-and-hold units may receive and sample-hold a reset signal and an image signal during a sampling phase of the image sensor. The conventional sample-and-hold units may transmit a reset signal and image signal output from a column corresponding to the pixel array to the signal converter by sequentially turning on or off at an evaluation phase.

FIG. 1 is a circuit diagram illustrating a conventional sample-and-hold array and signal converter. FIG. 2A is a circuit diagram of a sample-and-hold array and an output stage in a sample phase. FIG. 2B is a circuit diagram of a sample-and-hold array and an output stage in an evaluation phase.

Referring to FIGS. 1 to 2B, a conventional sample-and-hold array 6 may transmit a reset signal Vres to a signal converter 7 through a first bus B11. The sample-and-hold array may also transmit an image signal Vsig to a signal converter 7 through a second bus B21. In doing so, the reset signal Vres and the image signal Vsig may be distorted by a first parasitic capacitance Cp1 of the first bus B11 and a second parasitic capacitance Cp2 of the second bus B21. In addition, a digital image signal Vout may be distorted by an offset voltage Voff1 of an operational amplifier OP1 of the signal converter 7.

During a sampling phase (shown in FIG. 2A) of the conventional image sensor, an amount of charge Q1, Q2, Q3 and Q4 stored in capacitors C11, C21, C31 and C41, respectively, an amount of charge Qp1 stored in a first parasitic capacitance Cp1, and an amount of charge Qp2 stored in a second parasitic capacitance Cp2 may be calculated and displayed using the following equations.

$Q11=C11*(Vres-Vcom)$ $Q21=-C21*Voff1$ $Qp1=-Cp1*(Vcom+Voff1)$ $Q31=C31*(Vsig-Vcom)$ $Q41=0$ $Qp2=-Cp2*Vcom$ In this example, Vcom is a common voltage supplied to the conventional image sensor.

During an evaluation phase (as shown in FIG. 2B) of the conventional image sensor, an amount of charge Q1', Q2', Q3', and Q4' stored in capacitors C11, C21, C31, and C41, respectively, an amount of charge Qp1' stored in a first parasitic capacitance Cp1, and an amount of charge Qp2' stored in a second parasitic capacitance Cp2 may be calculated and displayed using the following equations.

$Q11'=C11*(Vcom-Vx-Voff1)$ $Q21'=C21*(Vout-Vx-Voff1)$ $Qp1'=-Cp1*(Vx+Voff1)$ $Q31'=C31*(Vcom-Vx)$ $Q41'=C41*(Vcom-Vx)$ $Qp2'=-Cp2*Vx$ In this example, Vx is a voltage of a first input terminal (e.g., a positive input terminal (+)) of an operational amplifier OP1. The value of the voltage Vx does not consider an offset voltage Voff1 of an operational amplifier OP1.

According to the law of conservation of charge, Q11+Q21+Qp1=Q11'+Q21'+Qp1' and Q31+Q41+Qp2=Q31'+Q41'+Qp2'. When C11=C31 and C21=C41, an output signal Vout of conventional signal converter 7 may be calculated using the following equation.

$Vout=Vcom+(C11/C21)*(Vres-Vsig)+(Cp1-Cp2)*(Vx-Vcom)/C2+(C1/C2)*Voff1$

According to the conventional art, a first parasitic capacitance Cp1 of a first bus B11, a second parasitic capacitance Cp2 of a second bus B21 and an input offset voltage Voff of an operational amplifier OP1 may remain in a third and a fourth term, so that a reset signal Vres, an image signal Vsig, and/or a digital image signal Vout may become distorted.

SUMMARY

Example embodiments relate to image sensors, interfaces and methods capable of suppressing and/or canceling parasitic capacitance effects of each bus transmitting a reset signal and an image signal output from an image sensor.

At least one example embodiment provides an interface capable of suppressing and/or canceling an input offset voltage of an operational amplifier and a method thereof. At least one other example embodiment, provides an interface capable of acquiring linear voltage gain characteristics of a digital image signal by suppressing and/or canceling an effect of parasitic capacitance included in a bus and an offset voltage of an operational amplifier, and a method thereof.

At least one example embodiment is directed to an interface. According to at least this example embodiment, a first operational amplifier may include a first input terminal connected to a first bus and a second input terminal connected to a first power supply. A second operational amplifier may include a third input terminal connected to a second bus and a fourth input terminal connected to the first power supply. In a sampling phase, an array of switches may be arranged to connect a first capacitor between the first power supply and the first input terminal, and a second capacitor between the first power supply and the third input terminal. In an evaluation phase, the array of switches may be arranged to connect the first capacitor between an output terminal of the first operational amplifier and the first input terminal, and the second capacitor between an output terminal of the second operational amplifier and the third input terminal.

According to example embodiments, in the sampling phase, the array of switches may be further arranged to connect the output terminal of the first operational amplifier and the output terminal of the second operational amplifier with the first input terminal and the third input terminal, respectively. The interface may further include a controller configured to output a plurality of switching signals switching a corresponding one of the switches.

At least one other example embodiment provides an interface. According to at least this example embodiment, a first operational amplifier may include a first input terminal connected to a first bus and a second input terminal connected to a first power supply. A second operational amplifier may include a third input terminal connected to a second bus and a fourth input terminal connected to the first power supply. A first switch may be connected between an output terminal of the first operational amplifier and the first input terminal. A first capacitor may have a first terminal connected to the first input terminal. A second switch may be connected between a second terminal of the first capacitor and the output terminal of the first operational amplifier. A third switch may be connected between second terminal of the first capacitor and the first power supply. A fourth switch may be connected between an output terminal of the second operational amplifier and the third input terminal. A second capacitor may have a first terminal connected to the third input terminal. A fifth switch connected between a second terminal of the second capacitor and the output terminal of the second operational amplifier, and a sixth switch connected between the second terminal of the second capacitor and the first power supply.

According to at least some example embodiments, the first power supply may be a common voltage supplied to an image sensor. The first bus may transmit a reset signal output from a pixel array of an image sensor and the second bus may transmit an image signal output from a pixel array of the image sensor.

At least one other example embodiment provides an image sensor. According to at least this example embodiment, a pixel array may include a plurality of pixels. Each of the plurality of pixels may be configured to generate and output a reset signal and a corresponding image signal. A sample-and-hold array may receive and sample-hold the reset signals and corresponding image signals, and sequentially output each reset signal and corresponding image signal through a first bus and a second bus, respectively. An output stage may be connected to the first bus and the second bus. The output stage may cancel an effect of parasitic capacitance included in the first bus and/or the second bus, convert the reset signal and corresponding image signal output from the sample-and-hold array to a single ended signal, and output the single ended signal as a digital image signal.

According to at least some example embodiments, the output stage may include an interface connected to the first bus and the second bus. The interface may cancel the effect of the parasitic capacitance included in the first bus and/or the second bus and output the reset signal and corresponding image signal output from the sample-and-hold array. A signal converter may receive the reset signal and corresponding image signal, convert the received reset signal and corresponding image signal to a single ended signal, and output the single ended signal. An output buffer may buffer the single ended signal.

According to at least some example embodiments, the interface may include a first operational amplifier, a second operational amplifier and an array of switches. The first operational amplifier may include a first input terminal connected to a first bus and a second input terminal connected to a first power supply. The second operational amplifier may include a third input terminal connected to a second bus and a fourth input terminal connected to the first power supply. In a sampling phase, the array of switches may be arranged to connect a first capacitor between the first power supply and the first input terminal, and a second capacitor between the first power supply and the third input terminal. In an evaluation phase, the array of switches may be arranged to connect the first capacitor between an output terminal of the first operational amplifier and the first input terminal, and the second capacitor between an output terminal of the second operational amplifier and the third input terminal.

At least one other example embodiment is directed to an interface method. According to at least this example embodiment, a reset signal and corresponding image signal generated by each pixel may be output to a sample-and-hold array. The sample-and-hold array may receive and sample-hold each reset signal and corresponding image signal, and sequentially output each reset signal and corresponding image signal through a first bus and a second bus, respectively. An effect of parasitic capacitance included in the first bus and the second bus may be suppressed and/or canceled. The reset signal and corresponding image signal may be converted to a single ended signal, and the converted single ended signal may be output as a digital image signal.

BRIEF DESCRIPTION OF THE DRAWINGS

Example embodiments will become more apparent from the following description of the example embodiments shown in the drawings in which.

DETAILED DESCRIPTION OF EXAMPLE EMBODIMENTS

Figure 1:
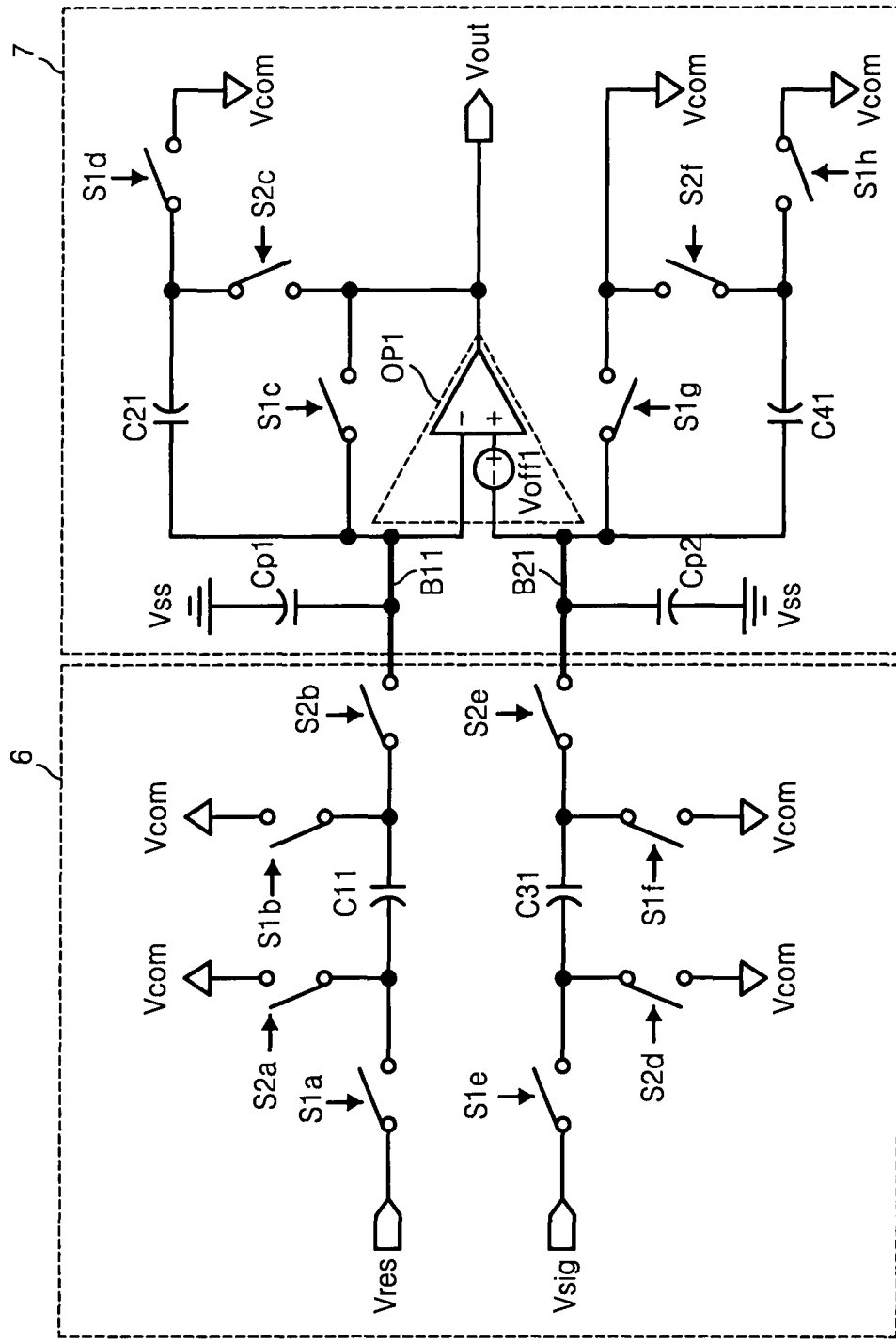
FIG. 1 illustrates a circuit diagram of a conventional sample-and-hold array and a signal converter.
Figure 2A:
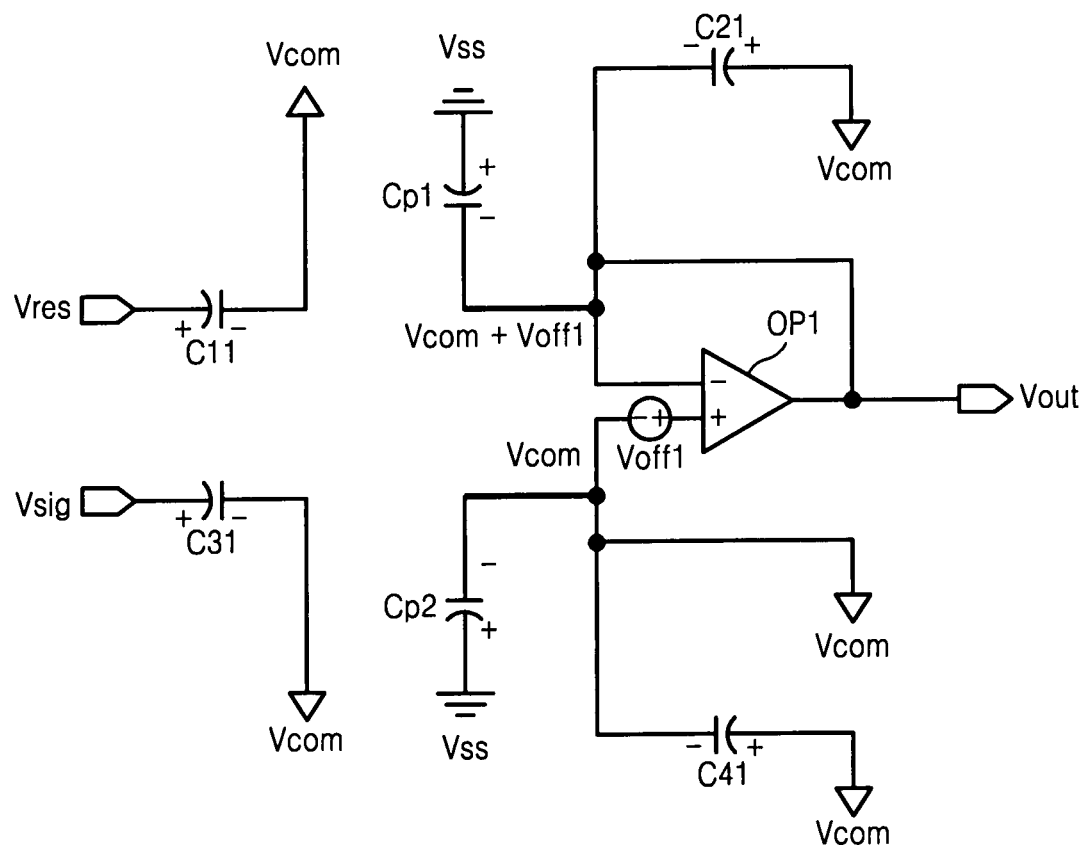
FIG. 2A is a circuit diagram of the conventional sample-and-hold array and the conventional signal converter of FIG. 1 in a sampling phase.
Figure 2B:
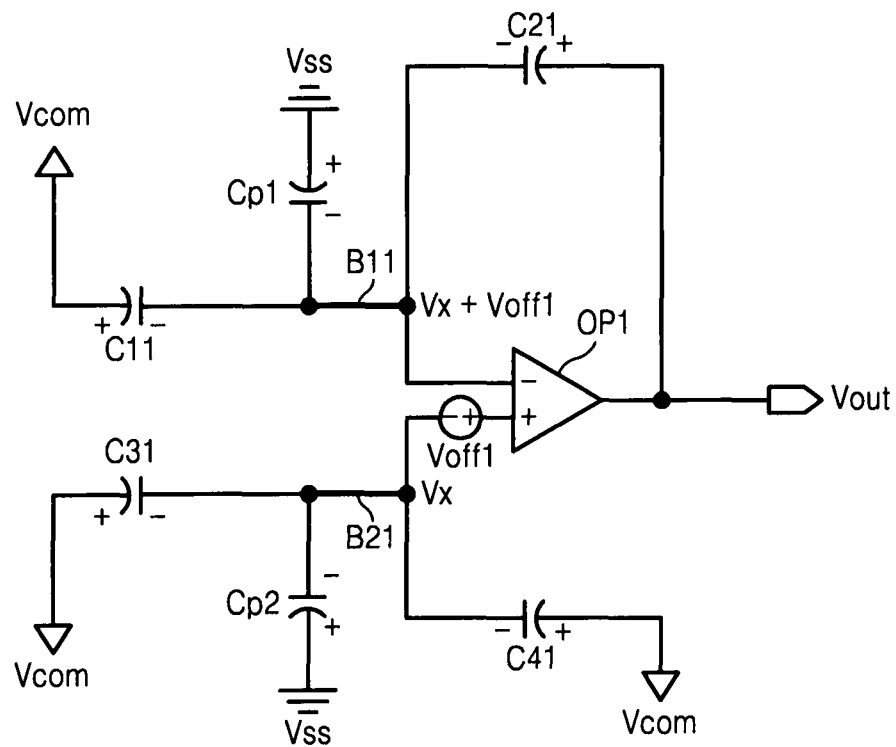
FIG. 2B is a circuit diagram of the conventional sample-and-hold array and the conventional signal converter of FIG. 1 in an evaluation phase.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
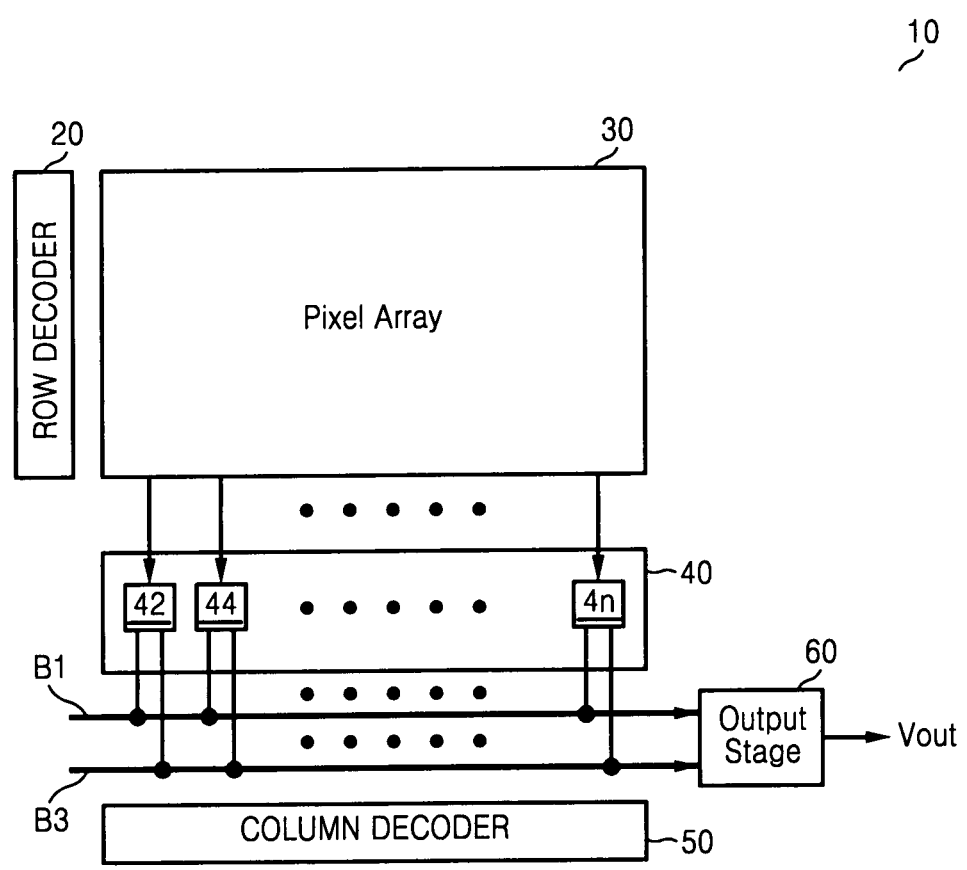
FIG. 3 is a functional block diagram of an image sensor according to an example embodiment.
Figure 4:
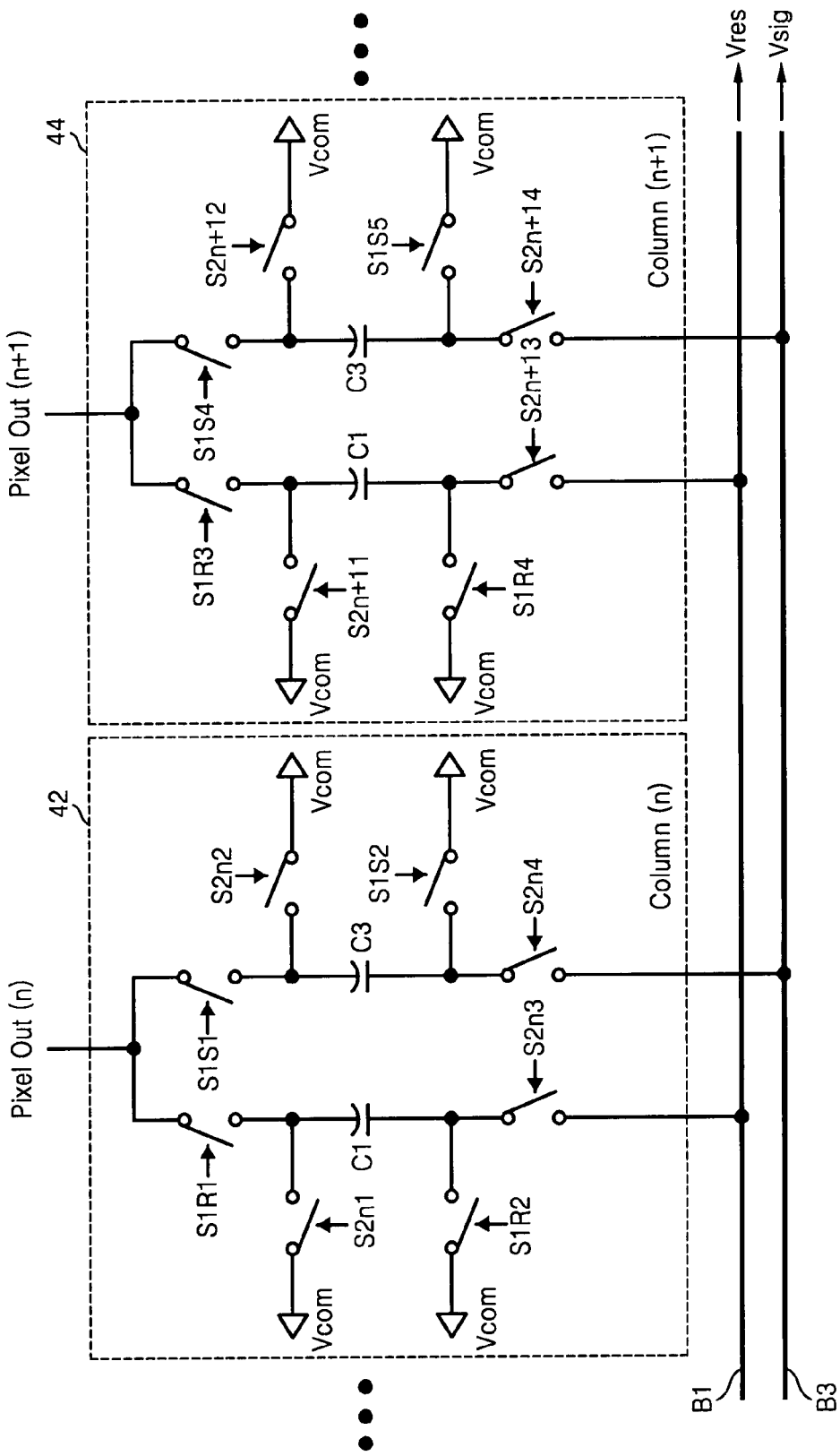
FIG. 4 illustrates a circuit diagram of a sample-and-hold array according to an example embodiment.
Figure 5:
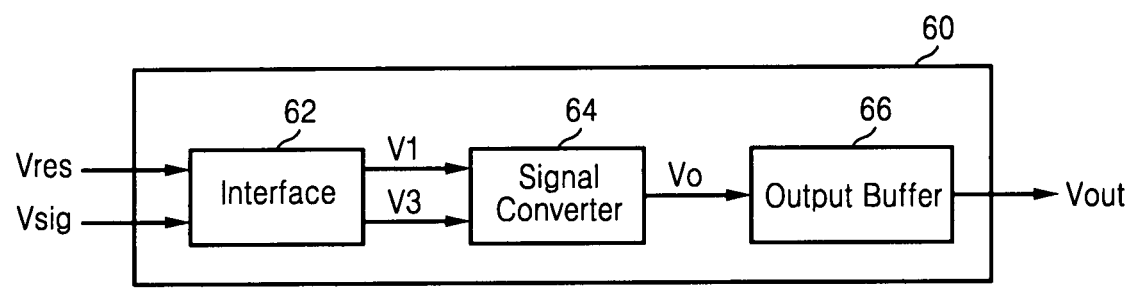
FIG. 5 is a functional block diagram of an output stage according to an example embodiment.
Figure 6:
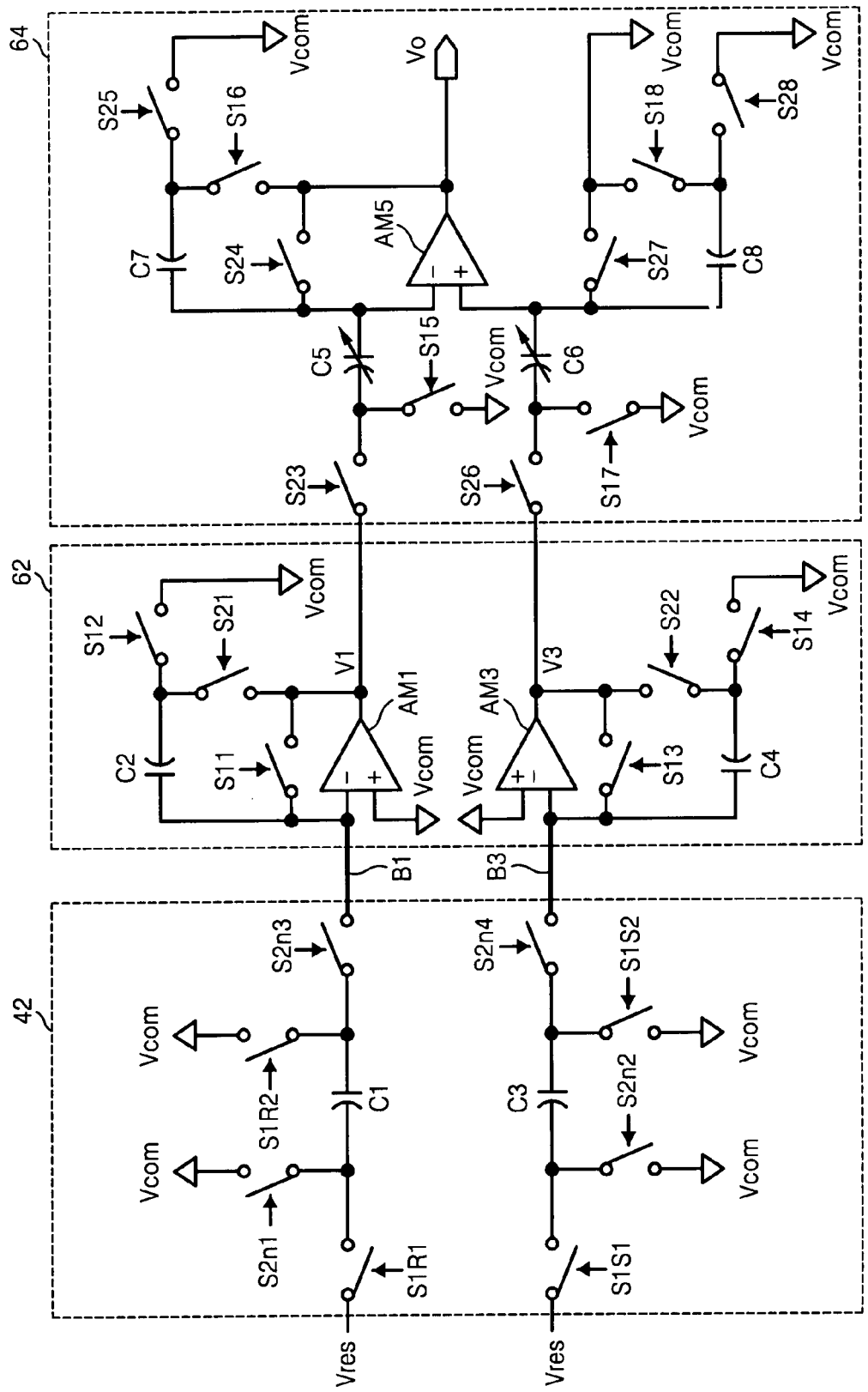
FIG. 6 illustrates a circuit diagram of a sample-and-hold array and an output stage according to an example embodiment.

FIG. 3 is a functional block diagram of an image sensor according to an example embodiment. FIG. 4 illustrates a circuit diagram of a sample-and-hold array according to an example embodiment. FIG. 5 is a functional block diagram of an output stage according to an example embodiment, and FIG. 6 illustrates a circuit diagram of a sample and hold array and an output stage according to an example embodiment.

Referring to FIGS. 3 to 6, an example embodiment of an image sensor 10 may include a row decoder 20, a pixel array 30, a sample-and-hold array 40, a column decoder 50 and/or an output stage 60.

The row decoder 20 may output a row selection signal (not shown) for selecting one of a plurality of row lines (not shown) included in the pixel array 30 in response to a received row address (not shown). The pixel array 30 may include a plurality of pixels (not shown) arranged in a two dimensional matrix structure. The plurality of pixels may output respective reset signals Vres and image signals Vsig based on the received row selection signal.

The sample-and-hold array 40 may sample and hold a reset signal Vres and an image signal Vsig output from each of pixels selected by a row selection signal (not shown). The row selection signal may be output to the pixel array 30 by row decoder 20. The sample-and-hold array 40 may transmit a reset signal Vres and an image signal Vsig. The sample-and-hold array 40 may select (e.g., sequentially select) the reset signal Vres and the image signal Vsig based on or in response to a column selection signal (not shown) output from a column decoder 50. The sample-and-hold array 40 may transmit the selected reset signal Vres and image signal Vsig to an output stage 60.

The sample-and-hold array 40 may include a plurality of sample-and-hold array circuits 42 to 4n. Each of sample-and-hold array circuits 42 to 4n may be connected to a corresponding column of the pixel array 30. The number of the plurality of sample-and-hold array circuits 42 to 4n may be the same or substantially the same as the number of columns of a pixel array 30.

FIG. 4 illustrates a circuit diagram of a portion of a sample-and-hold array (e.g., sample-and-hold array circuit 42) according to an example embodiment.

Figure 8A:
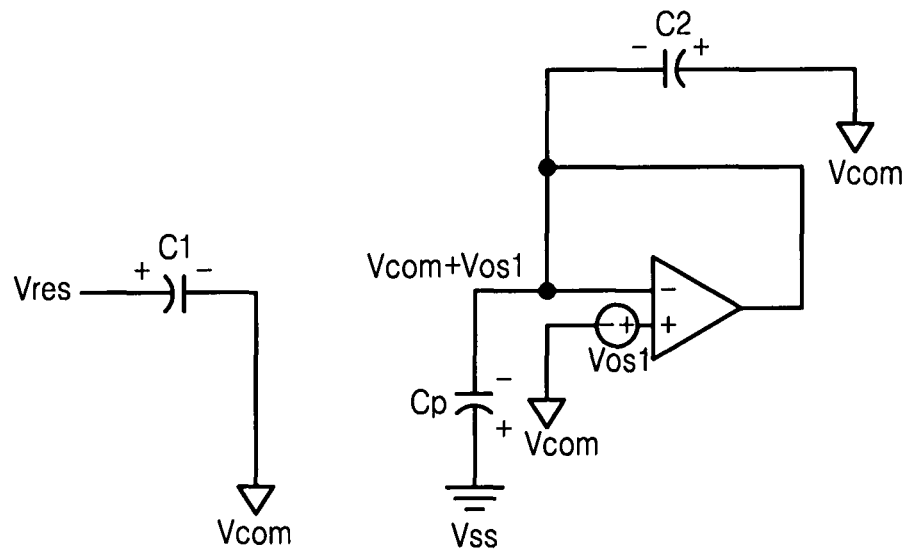
FIG. 8A is a circuit diagram of a sample-and-hold array and an interface according to an example embodiment during a sampling phase.

Referring to FIG. 4, the sample-and-hold array circuit 42 may include a first capacitor C1, a second capacitor C3 and a plurality of switch groups. The plurality of switch groups may include a first switching circuit (or first switch group), a second switching circuit (or second switch group), a third switching circuit (or third switch group), and a fourth switching circuit (or switch group). In a sampling phase (e.g., as shown in FIG. 8A), the first capacitor C1 may be connected between a first power supply Vcom and a terminal at which a reset signal Vres may be input by a first switching circuit. The first switching circuit may be switched in response to first switching signals S1R1 and S1R2 to sample the reset signal Vres.

The sample-and-hold array 40 may output the reset signal Vres to an output stage 60 through a first bus B1 and may output the image signal Vsig to an output stage 60 through a second bus B3.

The second capacitor C3 may be connected between a first power supply Vcom and a terminal at which an image signal Vsig may be input to a second switching circuit. The second switching circuit may be switched in response to second switching signals S1S1 and S1S2 to sample the image signal Vsig.

Figure 8B:
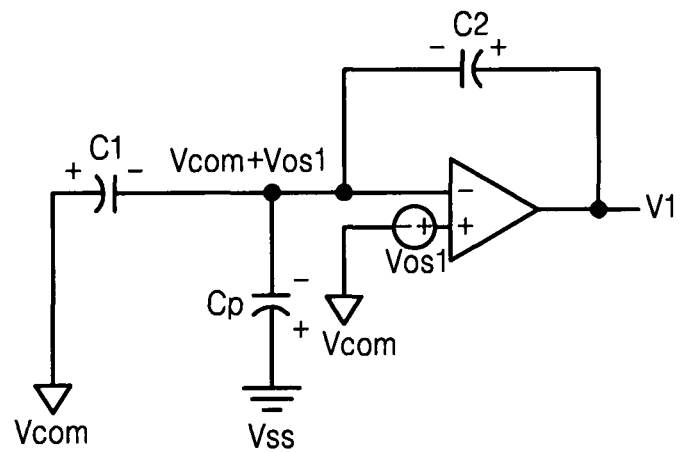
FIG. 8B is a circuit diagram of a sample-and-hold array and an interface according to an example embodiment during an evaluation phase.

In an evaluation phase (e.g., as shown in FIG. 8B), the first capacitor C1 may be connected between a first power supply Vcom and a first bus B1 by a third switching circuit. The third switching circuit may be switched in response to third switching signals S2$n$1 and S2$n$3 to transmit a reset signal Vres held by the first capacitor to the first bus B1.

The second capacitor C3 may be connected between a first power supply Vcom and a second bus B2 via a fourth switching circuit. The fourth switching circuit may be switched in response to third switching signals S2$n$2 and S2$n$4 to transmit an image signal Vsig stored or held by the second capacitor C3 to the second bus B3. The column decoder 50 may output a column selection signal (not shown) to cause transmission of a reset signal Vres and an image signal Vsig, which may be sample-held by sample-and-hold array 40, to an output stage 60, successively.

FIG. 5 is a functional block diagram of an output stage according to an example embodiment. Referring to FIG. 5, an example embodiment of an output stage 60, which may be connected between the first bus B1 and the second bus B3, may suppress, counteract and/or cancel effects of parasitic capacitance (e.g., Cp of FIG. 7A and Cm of FIG. 7B) included in the first bus B1 and the second bus B3, convert a reset signal Vres and an image signal Vsig output from the sample-and-hold array, buffer the converted single ended signal Vo, and output a buffered signal Vout as a digital image signal.

The output stage 60 may include an interface 62, a signal converter 64 and/or an output buffer 66. The interface 62 may be connected between a first bus B1 and a second bus B3. The interface 62 may suppress effects of the parasitic capacitance (e.g., Cp of FIG. 7A and Cm of FIG. 7B) included in the first bus B1 and the second bus B3 and may output a reset signal Vres and an image signal Vsig output from a sample-and-hold array 40.

Referring to FIG. 6, an example embodiment of the interface 62 may include a first operational amplifier AM1, a second operational amplifier AM3, a third capacitor C2, a fourth capacitor C4 and/or a first to a sixth switch. The first operational amplifier AM1 may include a first input terminal (−) connected to a first bus B1 and a second input terminal (+) connected to a first power supply Vcom. The second operational amplifier AM3 may include a third input terminal (−) connected to a second bus B3 and a fourth input terminal (+) connected to the first power supply Vcom.

During a sampling phase (e.g., as shown in FIG. 8A), the third capacitor C2 may be connected between the first power supply Vcom and the first input terminal (−) by a first switch switched in response to a first switching signal S12. The fourth capacitor C4 may be connected between the first power supply Vcom and the first input terminal (−) by a second switch switched in response to a second switching signal S14.

Also during the sampling phase (e.g., as shown in FIG. 8A), an output terminal of the first operational amplifier AM1 may be connected to the first input terminal (−) by a third switch switched in response to a third switching signal S11, and an output terminal of the second operational amplifier AM3 may be connected to the third input terminal (−) by a fourth switch switched in response to a fourth switching signal S13.

During an evaluation phase (e.g., as shown in FIG. 8B), the third capacitor C2 may be connected between an output terminal of a first operational amplifier AM1 and the first input terminal (−) by a fifth switch switched in response to a fifth switching signal S21. The fourth capacitor C4 may be connected between an output terminal of a second operational amplifier AM3 and the third input terminal (−) by a sixth switch switched in response to a sixth switching signal S22.

The signal converter 64 may receive the reset signal Vres and the image signal Vsig, may convert the received reset signal Vres and the received image signal Vsig to a single ended signal Vo, and may output the converted single ended signal Vo. In at least one example embodiment, the signal converter 64 may be embodied as a programmable gain amplifier PGA including a third operational amplifier AM5, a fifth to an eighth capacitor C5 to C8, and a fifth to an eighth switching circuit.

The third operational amplifier AM5 may include a fifth input terminal (−) connected to a terminal of a fifth capacitor C5 and a sixth input terminal (+) connected to a terminal of a sixth capacitor C6. During a sampling phase (e.g., as shown in FIG. 8A), a fifth switching circuit may connect the fifth capacitor C5 between a first power supply Vcom and a fifth input terminal (−), and may connect the seventh capacitor C7 between the fifth input terminal (−) and an output terminal of the third operational amplifier AM5 by being switched in response to fifth switching signals S15 and S16.

A sixth switching circuit may connect the sixth capacitor C6 between a first power supply Vcom and a sixth input terminal (+), and may connect the eighth capacitor C8 between the sixth input terminal (+) and the first power supply Vcom by being switched in response to sixth switching signals S17 and S18.

During an evaluation phase (e.g., as shown in FIG. 8B), a seventh switching circuit may connect the fifth capacitor C5 between an output terminal of a first operational amplifier AM1 and a fifth input terminal (−) of a third operational amplifier AM5, may connect the seventh capacitor C7 between the fifth input terminal (−) and the first power supply Vcom, and may connect the fifth input terminal (−) with an output terminal of the third operational amplifier AM5.

An eighth switching circuit may connect the sixth capacitor C6 between an output terminal of a second operational amplifier AM3 and a sixth input terminal (+) of a third operational amplifier AM5, may connect the sixth input terminal (+) to a first power supply Vcom, and may connect the eighth capacitor C8 between the sixth input terminal (+) and the first power supply Vcom. The output buffer 66 may buffer the single ended signal Vo and may output a buffered signal Vout as a digital image signal.

The image sensor 10 may further include a controller (not shown). The controller (not shown) may generate a plurality of switching signals. For example, the controller may generate first switching signals S1R1 and S1R2, second switching signals S1S1 and S1S2, third switching signals S2$n$1 and S2$n$3, fourth switching signals S2$n$2 and S2$n$4, a first switching signal S12, a second switching signal S14, a third switching signal S11, a fourth switching signal S13, a fifth switching signal S21, a sixth switching signal S22, fifth switching signals S15 and S16, sixth switching signals S17 and S18, seventh switching signals S23, S24, and S25, and eighth switching signals S26, S27, and S28.

The controller may enable first to fourth switching signals S12, S14, S11, and S13, fifth switching signals S15 and S16, and sixth switching signals S17 and S18 simultaneously or concurrently when the image sensor 10 is in a sampling phase. When the image sensor 10 is in an evaluation phase, the controller may enable a fifth switching signal S21, a sixth switching signal S22, seventh switching signals S23, S24, and S25, and eighth switching signals S26, S27, and S28 simultaneously or concurrently.

Figure 7A:
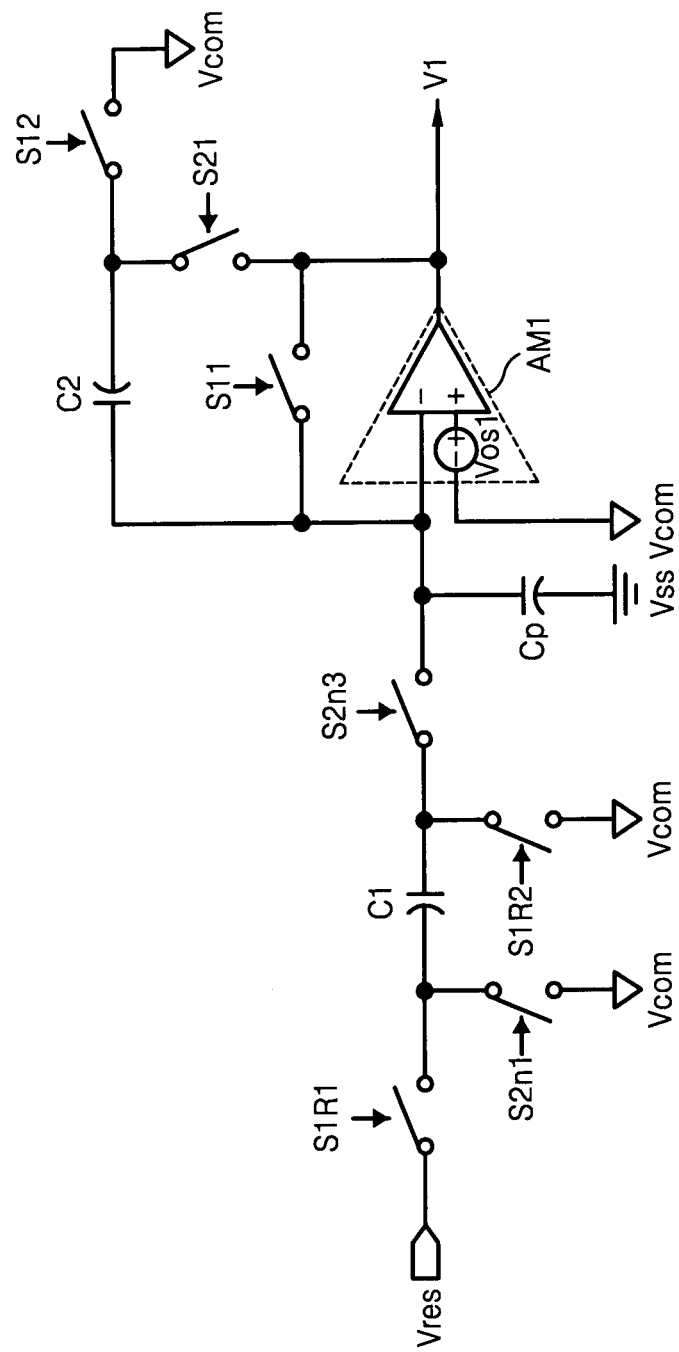
FIGS. 7A and 7B illustrate a circuit diagram of an interface according to an example embodiment.
Figure 7B:
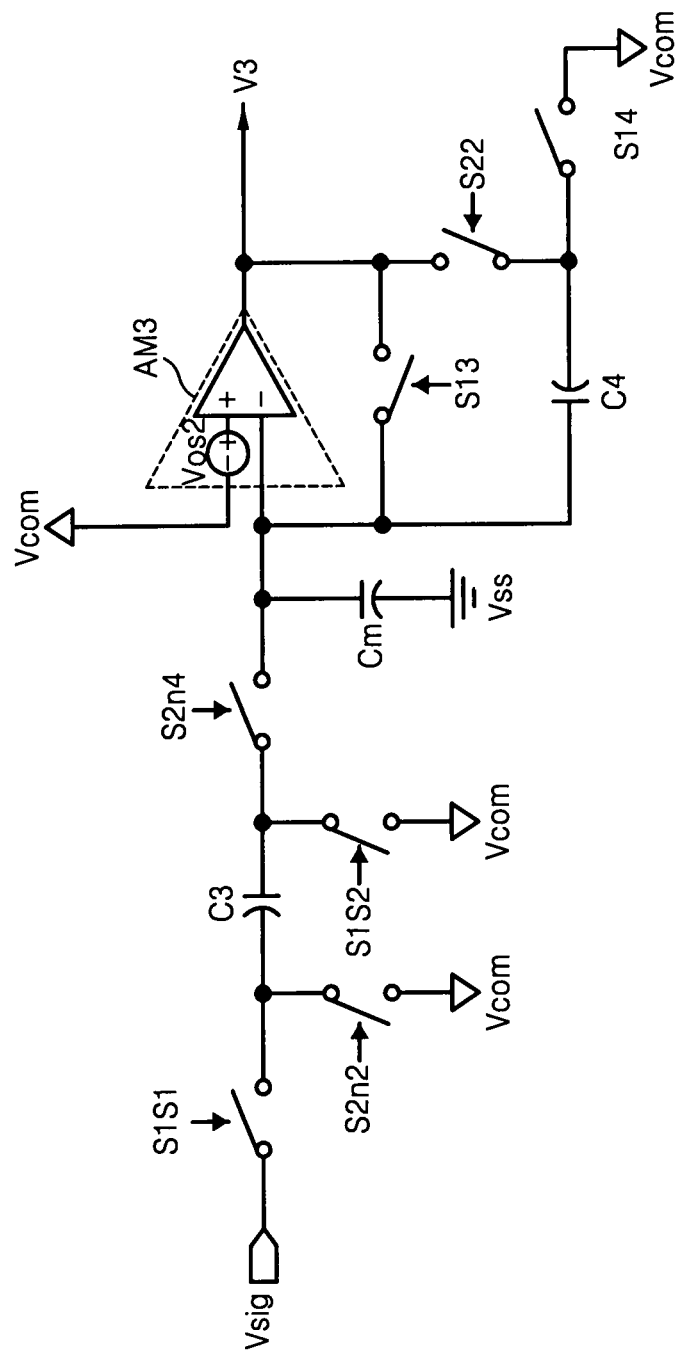
Figure 9:
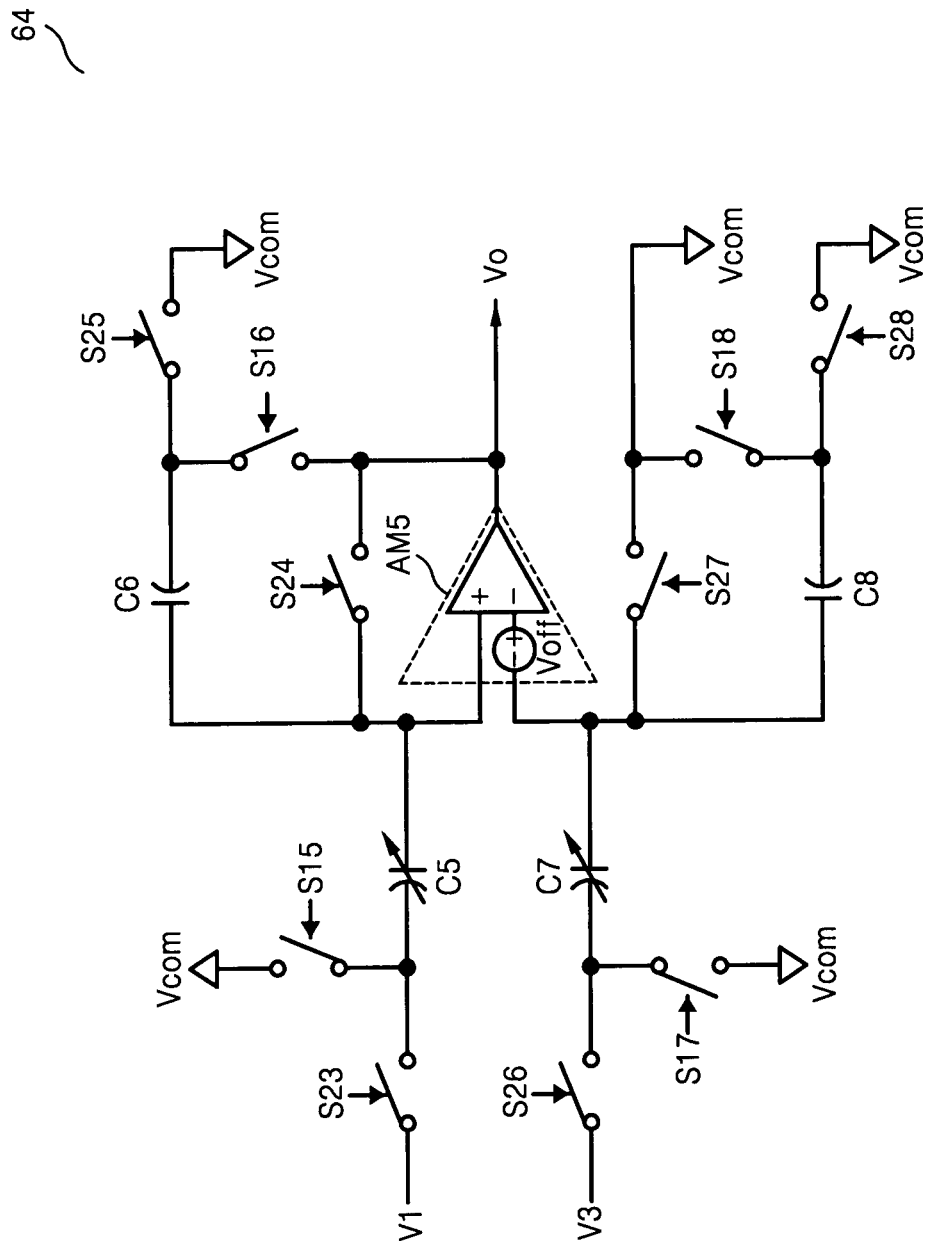
FIG. 9 illustrates a circuit diagram of a signal converter according to an example embodiment.
Figure 10A:
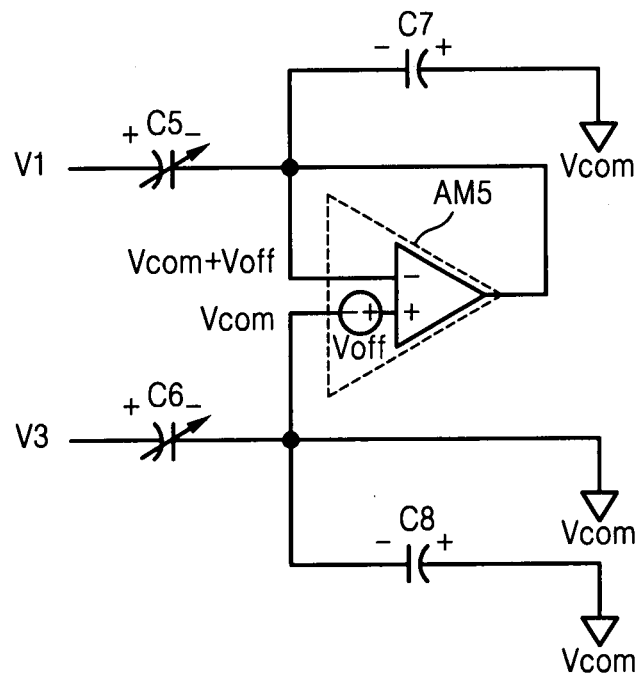
FIG. 10A is a circuit diagram of a signal converter according to an example embodiment during a sampling phase.
Figure 10B:
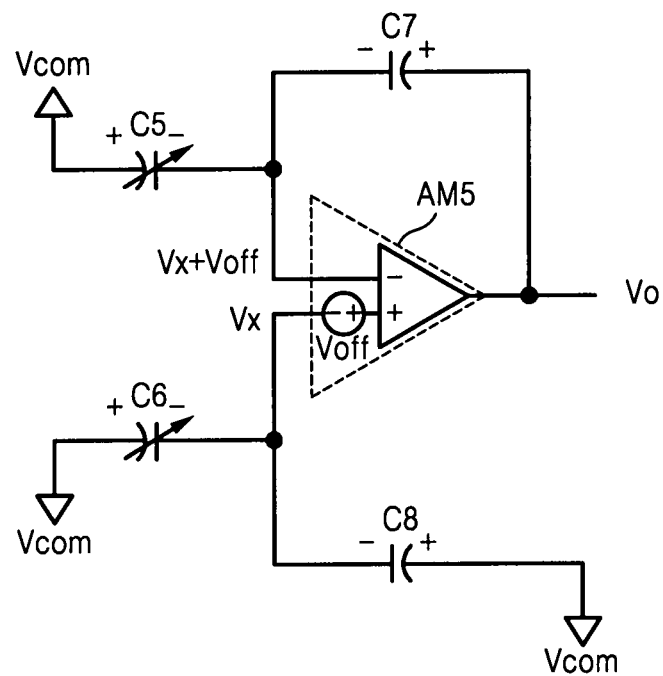
FIG. 10B is a circuit diagram of a signal converter according to an example embodiment during an evaluation phase.

FIGS. 7A and 7B illustrate circuit diagrams of interfaces according to example embodiments. FIG. 8A is a circuit diagram of a sample-and-hold array and an interface according to an example embodiment in a sampling phase. FIG. 8B is a circuit diagram of a sample-and-hold array and an interface according to an example embodiment in an evaluation phase. FIG. 9 illustrates a circuit diagram of a signal converter according to an example embodiment. FIG. 10A is a circuit diagram of a signal converter according to an example embodiment during a sampling phase. FIG. 10B is a circuit diagram of a signal converter according to an example embodiment during an evaluation phase.

Referring to FIGS. 7A to 10B, a first parasitic capacitance Cp may be in a first bus B1 connected to an interface 62 and a second parasitic capacitance Cm may be in a second bus B3.

A first offset voltage Vos1 may be in a first operational amplifier AM1, and a second offset voltage Vos2 may be in a second operational amplifier AM3. In a sampling phase (e.g., as shown in FIG. 8A), an amount of charge Q1 stored in a first capacitor C1, an amount of charge Q2 stored in a third capacitor C2, and an amount of charge Qp stored in a first parasitic capacitor Cp may be calculated using the following equations.

$$Q1 = C1*(Vres - Vcom)$$

$$Q2 = -C2*Vos1$$

$$Qp = -Cp*(Vcom + Vos1)$$

In an evaluation phase (e.g., as shown in FIG. 8B), an amount of charge Q1' stored in a first capacitor C1, an amount of charge Q2' stored in a third capacitor C2, and an amount of charge Qp' stored in a first parasitic capacitor Cp may be calculated using the following equations.

$$Q1' = -C1*Vos1$$

$$Q2' = C2*(V1 - Vcom - Vos1)$$

$$Qp' = -CP*(Vcom + Vos1)$$

In this example, according to the law of conservation of charge, Q1+Q2+Qp equals to Q1'+Q2'+Qp'. When C1 is the same or substantially the same as C2, an output voltage V1 of a first operational amplifier AM1 may be calculated using the following equation.

$$V1 = Vcom + (Vres - Vcom) + Vos1$$

In the same or substantially the same way, an output voltage V3 of a second operational amplifier AM3 may be calculated using the following equation.

$$V3 = Vcom + (Vsig - Vcom) + Vos2$$

According to at least this example embodiment, the interface 62 may suppress and/or cancel a first parasitic capacitor Cp of the first bus B1 and a second parasitic capacitor Cm of the second bus B3, such that a reset signal Vres and an image signal Vsig may be transmitted to a signal converter 64 with less distortion.

In addition, in a sampling phase of a signal converter 64 (e.g., as shown in FIG. 10A), an amount of charge Q5 stored in a fifth capacitor C5, an amount of charge Q6 stored in a sixth capacitor C6, an amount of charge Q7 stored in a seventh capacitor C7, and an amount of charge Q8 stored in an eighth capacitor C8 may be calculated using the following equations.

$$Q5 = C5*(V1 - Vcom - Voff)$$

$$Q6 = C6*(V3 - Vcom)$$

$$Q7 = -C7*Voff$$

$$C8 = 0$$

In an evaluation phase of a signal converter 64 (e.g., as shown in FIG. 10B), an amount of charge Q5' stored in a fifth capacitor C5, an amount of charge Q6' stored in a sixth capacitor C6, an amount of charge Q7' stored in a seventh capacitor C7, and an amount of charge Q8' stored in an eighth capacitor C8 may be calculated using the following equations.

$$Q5' = C5*(Vcom - Vx - Voff)$$

$$Q6' = C6*(Vcom - Vx)$$

$$Q7' = C7*(Vo - Vx - Voff)$$

$$Q8' = C8*(Vcom - Vx)$$

In this example, Vx is a voltage of a sixth input terminal (+) of a third operational amplifier AM5 and its value may not take into account or consider a third offset voltage Voff of a third operational amplifier AM5.

According to the law of conservation of charge, Q5+Q7 equals to Q5'+Q7', and Q6+C8 equals to Q6'+Q8'. When C5=C6, and C7=C8, an output signal Vo of a signal converter 64 may be calculated using the following equation.

$$Vo = Vcom + C5/C7*(Vres - Vsig) + C5/C7*(Vos1 - Vos2)$$

Therefore, according to at least this example embodiment, an output signal Vo of the signal converter 64 may not include a first parasitic capacitor Cp of a first bus B1 and a second parasitic capacitor Cm of the second bus B3, such that distortion of an output signal Vo caused by the first capacitor Cp and the second capacitor Cm may be suppressed and/or prevented. In addition, an output signal Vo of a signal converter 64 may not include a third offset voltage Voff of a third operational amplifier AM5, such that signal distortion caused by a third offset voltage may be reduced and/or prevented.

Additionally, according to example embodiments, an output signal Vo of the signal converter 64 may include a first offset voltage Vos1 and a second offset voltage Vos2. However, when a first operational amplifier AM1 and a second operational amplifier AM3 are embodied as an amplifier having the same or substantially the same circuit, an error term of an output signal Vo of the signal converter 64 (e.g., C5/C7*(Vos1−Vos2)), may be suppressed and/or cancelled. As a result, signal distortion resulting from an offset voltage may be reduced and/or prevented.

As shown in an equation illustrating an output signal Vo of the signal converter 64, voltage gain of the signal converter 64 may be "C5/C6", which may be changed by altering C5, such that linear voltage gain characteristics may improve.

Figure 11:
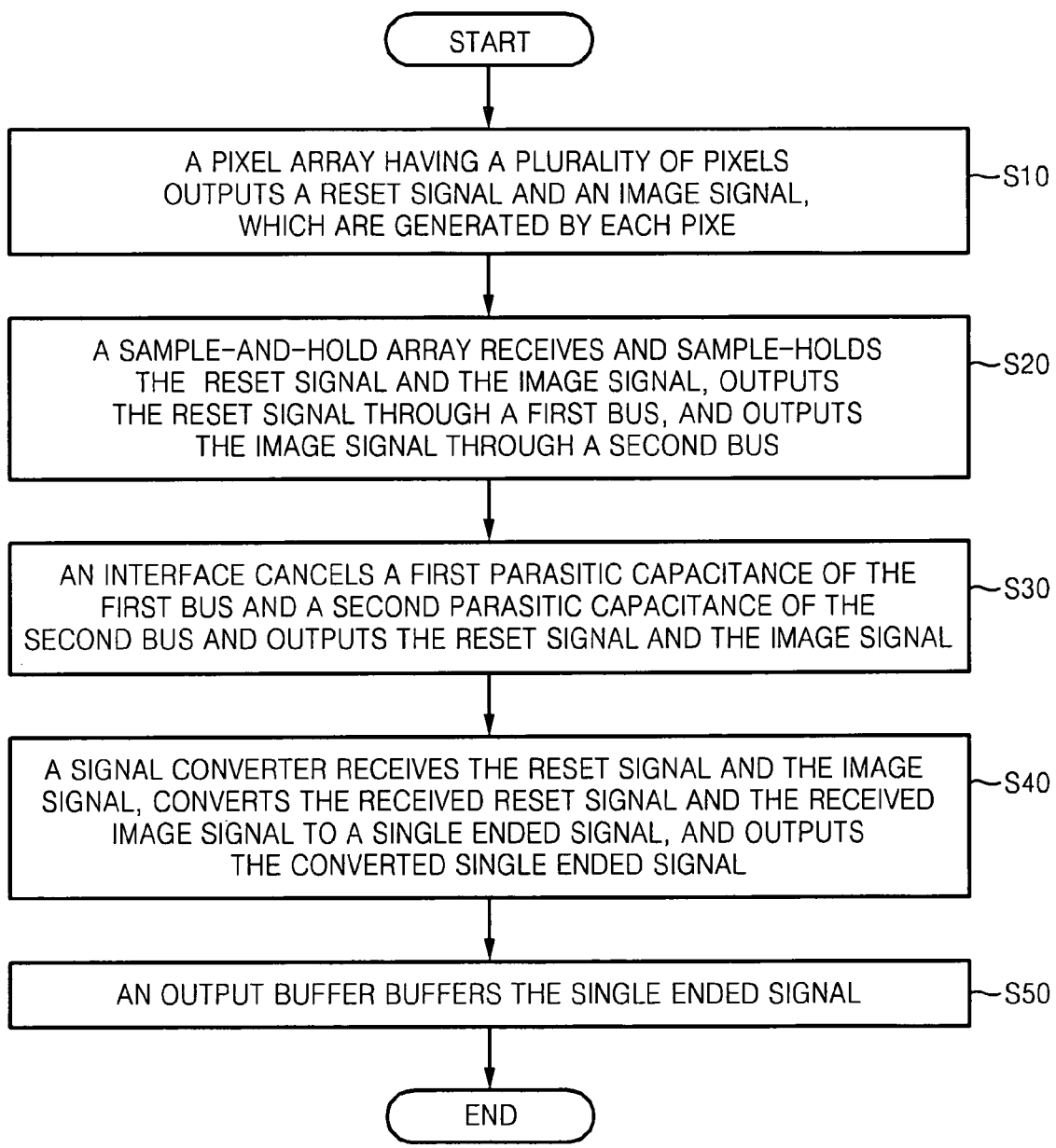
FIG. 11 is a flowchart illustrating an interface method according to another example embodiment.

FIG. 11 is a flow chart illustrating an interface method according to an example embodiment. For example purposes, the method shown in FIG. 11 will be discussed with regard to the interface shown in FIG. 3, for example. Referring to FIGS. 3 to 11, a pixel array 30 having a plurality of pixels may output a reset signal Vres and an image signal Vsig (S10). Each of the plurality of pixels may generate a reset signal Vres and an image signal Vsig. A sample-and-hold array 40 may receive, sample and hold the reset signals Vres and the image signals Vsig output by the pixel array 30. The sample-and-hold array 40 may output the reset signal Vres through a first bus B1, and output the image signal Vsig through a second bus B3 (S20).

An interface 62 may suppress and/or cancel a first parasitic capacitance Cp of the first bus B1 and/or a second parasitic capacitance Cm of the second bus B3 and output the reset signal Vres and the image signal Vsig (S30). A signal converter 64 may receive the reset signal Vres and the image signal Vsig, convert the received reset signal Vres and the received image signal Vsig to a single ended signal Vo, and output the converted single ended signal Vo (S40). An output buffer 66 may buffer the single ended signal Vo (S50).

As described above, interfaces and methods according to example embodiments may suppress, counteract and/or prevent distortion of a digital image signal caused by parasitic capacitance effects by suppressing and/or canceling parasitic capacitance effects included in buses transmitting reset signals and/or image signals output from an image sensor. According to example embodiments, reducing and/or canceling an offset voltage of an operational amplifier of an output stage may suppress and/or prevent distortion of a digital image signal by an offset voltage.

According to example embodiments, linear voltage gain characteristics of a digital image signal may be obtained by suppressing and/or canceling parasitic capacitance effects in a bus transmitting reset signals and/or image signals output from an image sensor, and an offset voltage of an operational amplifier of an output stage.

Although example embodiments have been shown and described with reference to those shown in the drawings, it will be appreciated by those skilled in the art that changes may be made in these example embodiments without departing from the principles and spirit of the present invention, the scope of which is defined in the appended claims and their equivalents.

What is claimed is:

1. An image sensor comprising:
   a pixel array including a plurality of pixels, each of the plurality of pixels being configured to output a reset signal and a corresponding image signal;
   a sample-and-hold array circuit configured to receive and sample-hold the plurality of reset signals and corresponding image signals, the sample-and-hold array circuit being further configured to sequentially output each of the plurality of reset signals through a first bus and each of the corresponding image signals through a second bus; and
   an output stage connected to the first bus and the second bus, the output stage being configured to cancel an effect of a parasitic capacitance of the first bus and the second bus, convert each reset signal and corresponding image signal to a single ended signal, and output the converted single ended signal as a digital image signal, wherein the output stage includes,
      a signal converter configured to convert each reset signal and corresponding image signal to a single ended signal, and output the single ended signal,
      an interface connected between the sample-and-hold array circuit and the signal converter, the interface being configured to cancel the effect of a parasitic capacitance of the first bus and the second bus, and
      an output buffer configured to buffer the single ended signal, wherein the interface includes,
      a first capacitor and a second capacitor;
      a first operational amplifier including a first input terminal connected to the first bus and the second input terminal connected to a first power supply;
      a second operational amplifier including a third input terminal connected to a second bus and a fourth input terminal connected to the first power supply; and
      a switching circuit including a plurality of switches, the plurality of switches being configured to,
         connect the first capacitor between the first power supply and the first input terminal, and to connect the second capacitor between the first power supply and the third input terminal in a sampling phase, and
         connect the first capacitor between an output terminal of the first operational amplifier and the first input terminal and to connect the second capacitor between an output terminal of the second operational amplifier and the third input terminal in an evaluation phase.

2. The image sensor of claim 1, wherein the plurality of switches are further configured to connect the output terminal of the first operational amplifier with the first input terminal and the output terminal of the second operational amplifier with the third input terminal.

3. The image sensor of claim 1, wherein the first power supply is a common voltage supplied to an image sensor.

4. The image sensor of claim 1, wherein the first bus transmits a reset signal output from a pixel array of an image sensor and the second bus transmits an image signal output from the pixel array of the image sensor.

5. The image sensor of claim 1, wherein the plurality of switches includes,
   a first switch connected between an output terminal of the first operational amplifier and the first input terminal,
   a second switch connected between a first terminal of the first capacitor and the output terminal of the first operational amplifier,
   a third switch connected between the a second terminal of the first capacitor and the first power supply,
   a fourth switch connected between an output terminal of the second operational amplifier and the third input terminal,
   a fifth switch connected to a first terminal of the second capacitor and the output terminal of the second operational amplifier, and
   a sixth switch connected between a second terminal of the second capacitor and the first power supply.

6. The image sensor of claim 5, wherein the first power supply is a common voltage supplied to an image sensor.

7. The image sensor of claim 5, wherein the first bus transmits a reset signal output from a pixel array of an image sensor and the second bus transmits an image signal output from the pixel array of the image sensor.

* * * * *